US011320492B2

(12) United States Patent
Gu et al.

(10) Patent No.: US 11,320,492 B2
(45) Date of Patent: May 3, 2022

(54) SYSTEMS AND METHODS OF POWER SYSTEM STATE ESTIMATION

(71) Applicants: Global Energy Interconnection Research Institute Co. Ltd, Beijing (CN); State Grid Corporation of China Co. Ltd, Beijing (CN); State Grid Jiangsu Electric Power Co., LTD., Jiangsu (CN); State Grid ShanXi Electric Power Company, Shandong (CN)

(72) Inventors: Yingzhong Gu, San Jose, CA (US); Guanyu Tian, San Jose, CA (US); Chunlei Xu, San Jose, CA (US); Qibing Zhang, San Jose, CA (US); Ruisheng Diao, San Jose, CA (US); Di Shi, San Jose, CA (US)

(73) Assignees: Global Energy Interconnection Research Institute Co. Ltd, Beijing (CN); State Grid Coporation of China Co. Ltd, Beijing (CN); State Grid Jiangsu Electric Power Co., LTD., Nanjing (CN); State Grid ShanXi Electric Power Company, Jinan (CN)

( * ) Notice: Subject to any disclaimer, the term of this patent is extended or adjusted under 35 U.S.C. 154(b) by 0 days.

(21) Appl. No.: 17/091,831

(22) Filed: Nov. 6, 2020

(65) Prior Publication Data

US 2021/0141029 A1 May 13, 2021

Related U.S. Application Data

(60) Provisional application No. 62/932,335, filed on Nov. 7, 2019.

(51) Int. Cl.
 *G01R 31/50* (2020.01)
 *G06N 3/02* (2006.01)
 *G01R 21/133* (2006.01)

(52) U.S. Cl.
 CPC .......... *G01R 31/50* (2020.01); *G01R 21/133* (2013.01); *G06N 3/02* (2013.01)

(58) Field of Classification Search
 CPC ......... G01R 31/50; G01R 21/133; G06N 3/02
 See application file for complete search history.

(56) References Cited

U.S. PATENT DOCUMENTS

| 5,821,195 A | 10/1998 | Sandbrink et al. |
| 6,130,186 A | 10/2000 | Ward et al. |

(Continued)

FOREIGN PATENT DOCUMENTS

| CN | 108732926 A | 11/2018 |
| CN | 110490378 A | 11/2019 |
| EP | 3107174 B1 | 6/2015 |

OTHER PUBLICATIONS

Tian et al., "Neural Network-Based Power System State Estimation with Extended Observability", Journal of Modern Power Systems and Clean Energy, vol. 9, No. 5, pp. 1-11, Sep. 2021.

*Primary Examiner* — Manuel A Rivera Vargas
(74) *Attorney, Agent, or Firm* — Greenberg Traurig, LLP

(57) ABSTRACT

State estimation in an electric power system includes acquiring electrical measurements from the electric power system at a reporting rate of the electrical measurements, processing the electrical measurements into sequence data including positive sequence data, processing positive sequence data by an observable state estimator to generate a plurality of estimated states including a plurality of estimated observable states, parameters of the observable state estimator being updated by a first training module in a first time thread, processing the plurality of estimated states by an unobserv- (Continued)

able state estimator to generate a plurality of estimated unobservable states, parameters of the unobservable state estimator being updated by a second training module in a second time thread independent of the first time thread, and outputting a plurality of final estimated states generated by concatenating the plurality of estimated observable states and the plurality of estimated unobservable states.

25 Claims, 14 Drawing Sheets

(56) References Cited

U.S. PATENT DOCUMENTS

| | | |
|---|---|---|
| 6,475,953 B1 | 11/2002 | Ward et al. |
| 7,507,775 B2 | 3/2009 | Leatherman et al. |
| 7,519,506 B2 | 4/2009 | Trias |
| 7,645,720 B2 | 1/2010 | Leatherman et al. |
| 7,652,072 B2 | 1/2010 | Leatherman et al. |
| 7,700,797 B2 | 4/2010 | Leatherman et al. |
| 7,723,265 B2 | 5/2010 | Xu et al. |
| 7,879,916 B2 | 2/2011 | Leatherman et al. |
| 7,935,842 B2 | 5/2011 | Policello et al. |
| 7,964,552 B2 | 6/2011 | Herzog et al. |
| 8,734,821 B2 | 5/2014 | Hollis et al. |
| 9,034,960 B2 | 5/2015 | Brown et al. |
| 2007/0131611 A1 | 6/2007 | Peng et al. |
| 2015/0094965 A1* | 4/2015 | Schneider ........... H02J 13/0004 702/58 |
| 2018/0086222 A1 | 3/2018 | Juang et al. |
| 2018/0259556 A1* | 9/2018 | Labatie ................ G01R 21/133 |
| 2020/0099252 A1* | 3/2020 | Cintuglu .............. G01R 21/133 |

* cited by examiner

SYSTEMS AND METHODS OF POWER SYSTEM STATE ESTIMATION

CROSS-REFERENCE TO RELATED APPLICATIONS

This application claims priority to U.S. Provisional Application No. 62/932,335 filed on 7 Nov. 2019 and entitled "Method for Power System State Estimation Using Neural Network," and is herein incorporated by reference in its entirety.

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in drawings that form a part of this document: Copyright, GEIRI North America, All Rights Reserved.

FIELD OF TECHNOLOGY

The present disclosure generally relates to electric power transmission and distribution system, and, more particularly, to systems and methods of power system state estimation.

BACKGROUND OF TECHNOLOGY

Modern power systems rely on many autonomous control algorithms to improve response speed and decision-making toward system state changes. Since many of these algorithms are used for making decisions on system state in real-time, numerous state estimation methods have been proposed to improve estimation accuracy, efficiency, and robustness. These methods can be classified into two categories: i) minimizing estimated measurement residuals, and ii) probability based estimation. Examples of the first type include the weighted least squares (WLS) method, weighted least absolute value (WLAV) method, and the optimization-based methods that formulate the measurement residuals in their objective functions. See A. Abur and A. G. Exposito, Power system state estimation: theory and implementation. CRC press, 2004. The second type, namely probability-based estimation, tries to find the value of states with the highest likelihood, e.g., Bayesian estimation, details of which are discussed in K. R. Mestav, J. Luengo-Rozas, and L. Tong, "Bayesian state estimation for unobservable distribution systems via deep learning," IEEE Transactions on Power Systems, vol. 34, no. 6, pp. 4910-4920, 2019.

Measurements in practical systems typically contain noise, which is unavoidable. It is important that a state estimation algorithm can attain certain computational accuracy under the presence of noise. For example, for WLS, which is the most widely used state estimation method, the estimation accuracy is highly affected by weight matrix that describes the quality of the measurements. The weight matrix is hard to quantify directly in practice unless weight tuning algorithms are applied. For example, R. Jabr and B. Pal, "Iteratively reweighted least-squares implementation of the WLAV state-estimation method," IEE Proceedings-Generation, Transmission and Distribution, vol. 151, no. 1, pp. 103-108, 2004 introduces an iterative algorithm to identify optimal weights.

As the number of phasor measurement unit (PMU) installations continues to increase world-wide, some regional systems have become nominally observable due to pure PMU data available at the transmission level. For example, the North American grid has over 1,700 PMUs and 200 phasor data condensers (PDCs), which provide a good amount of synchrophasor data for relevant applications (SmartGrid.gov, "Advancement of synchrophasor technology," https://www.smartgrid.gov/document/Synchrophasor Report 201603.html), especially for linear state estimation (LSE), which is a WLS method with high computational efficiency (L. Zhang, A. Bose, A. Jampala, V. Madani, and J. Giri, "Design, testing, and implementation of a linear state estimator in a real power system," IEEE Transactions on Smart Grid, vol. 8, no. 4, pp. 1782-1789, 2016).

The concept of pure PMU data-driven LSE was first proposed in state estimation with phasor measurements," in 2009 IEEE/PES Power Systems Conference and Exposition. IEEE, 2009, pp. 1-7. It has a higher time efficiency as compared to conventional SCADA-based state estimation methods due to its linear and non-iterative feature in the solution process. The drawbacks of PMU data-driven LSE, however, are that the calculation of the measurement model H matrix is computationally complex, especially with large state dimensions, and it is sensitive to erroneous measurements. Moreover, since LSE is a direct solution method, the erroneous data may significantly affect the estimation accuracy.

Before high estimation accuracy can be achieved, there is a need to perform the task of data cleaning. See M. Netto and L. Mili, "Robust data filtering for estimating electromechanical modes of oscillation via the multichannel prony method," IEEE Transactions on Power Systems, vol. 33, no. 4, pp. 4134-4143, 2017. Many of the data pre-processing methods, such as statistical methods, are iterative. Larger systems with more measurements usually have a larger number of erroneous measurements. Therefore, the time consumption involved in bad data pre-processing tends to be higher and likely to limit the online implementation of LSE in large-scale systems.

There are other previous attempts aimed at solving these problems. Such as EP3107174A1 proposes a decentralized control scheme for a distribution subnetwork. CN108732926A uses a control theory for closed loop communication network estimation. CN201910724389.7A focuses on calculating the system states of the observable part of the network. US20180086222A1 proposes a form of recurrent neural network for determining the states for electric vehicle battery. U.S. Pat. No. 7,519,506B2 proposes a deterministic, non-iterative method using a holomorphic embedding and algebraic approximants for deterring the real-time load flow. However, none of the previous attempts provide an effective solution for the aforementioned problems.

As such, what is desired is state estimation systems and methods with high time efficiency, better robustness against noise and extended observation in a large-scale electric power system.

SUMMARY OF DESCRIBED SUBJECT MATTER

The presently disclosed embodiments relate to systems and methods for state estimation in electric power systems.

In some embodiments, the present disclosure provides an exemplary technically improved computer-based state estimation in an electric power system which includes acquiring electrical measurements from the electric power system at a reporting rate of the electrical measurements, processing the electrical measurements into sequence data including positive sequence data, processing positive sequence data by an observable state estimator to generate a plurality of estimated states including a plurality of estimated observable states, parameters of the observable state estimator being updated by a first training module in a first time thread, processing the plurality of estimated states by an unobservable state estimator to generate a plurality of estimated unobservable states, parameters of the unobservable state estimator being updated by a second training module in a second time thread independent of the first time thread, and outputting a plurality of final estimated states generated by concatenating the plurality of estimated observable states and the plurality of estimated unobservable states.

In some embodiments, the present disclosure provides an exemplary technically improved computer-based state estimation system and method in which the first time thread of the updating of the observable state estimator synchronizes with the reporting rate of the electrical measurements; and the second time thread is slower than the first time thread.

In some embodiments, the present disclosure provides an exemplary technically improved computer-based state estimation system and method in which the unobservable state estimator includes a plurality of estimation units, each of the plurality of estimation units estimates states of one unobservable node using inputs of states from a predetermined number of observable node nearest to the unobservable node in terms of electrical distance.

In some embodiments, the present disclosure provides an exemplary technically improved computer-based state estimation system and method in which the second training module include a trained stand-by estimator replacing the unobservable state estimator periodically.

BRIEF DESCRIPTION OF THE DRAWINGS

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

FIG. 1 shows an architecture of a neural network-based state estimation (NNSE) method according to an embodiment of the present disclosure.

FIG. 2 shows a flowchart of a neural network-based linear state estimation (NNLSE) process in accordance with an embodiment of the present disclosure.

FIG. 3 shows a feed-forward neural-network structure.

FIG. 4 shows a flowchart for an architecture of a complementary unobservable state estimation (USE) module.

FIG. 5 illustrates an architecture of a parallel process in an USE module.

FIG. 6 shows a flowchart of the multi-thread neural network training and updating architecture in accordance with embodiments of the present disclosure.

FIG. 7 shows a flowchart illustrating an exemplary application of the state estimation process in an electric power system in accordance with embodiments of the present disclosure.

FIG. 8 shows a topology of an IEEE 118-bus system.

FIG. 9 shows convergence of network loss and estimation error.

FIG. 10 shows a step-wise time consumption comparison.

FIG. 11 shows a comparison of estimation error at different noise levels.

FIG. 12 shows 0.01 noise estimation error trajectories.

FIG. 13 shows an example of bus 19 estimation.

FIG. 14 shows step-wise estimation error under a ramp-down transient.

FIG. 15 shows an example of bus 19 in ramp case.

FIG. 16 shows an example of bus 19 in topology change case.

DETAILED DESCRIPTION

Figure 1:
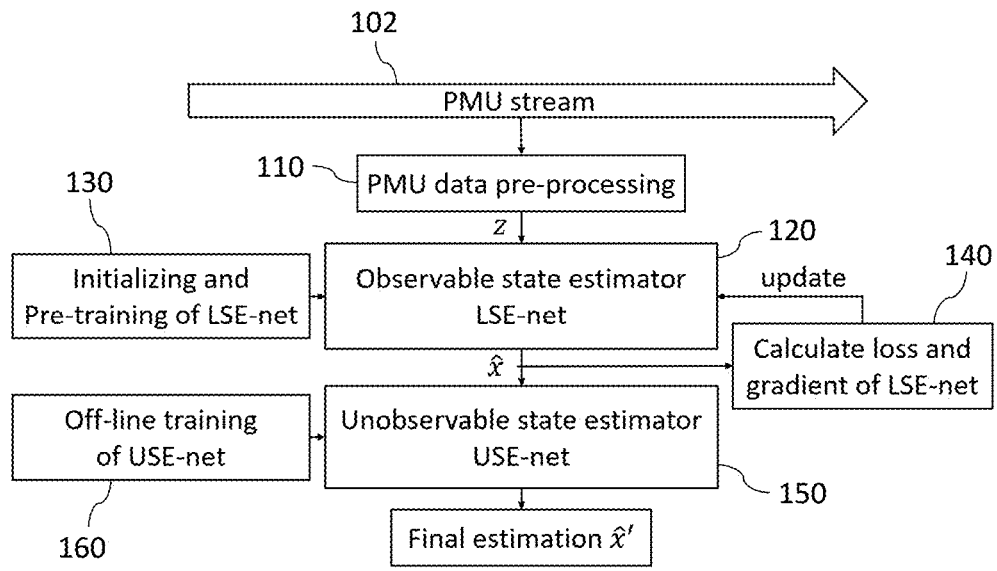
FIGS. 1-16 show one or more schematic flow diagrams, certain computer-based architectures, and/or computer-generated plots which are illustrative of some exemplary aspects of at least some embodiments of the present disclosure.

The present disclosure relates to neural network-based power system state estimation systems and methods. Various detailed embodiments of the present disclosure, taken in conjunction with the accompanying figures, are disclosed herein; however, it is to be understood that the disclosed embodiments are merely illustrative. In addition, each of the examples given in connection with the various embodiments of the present disclosure is intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though it may. Furthermore, the phrases "in another embodiment" and "in some other embodiments" as used herein do not necessarily refer to a different embodiment, although it may. Thus, as described below, various embodiments may be readily combined, without departing from the scope or spirit of the present disclosure.

In addition, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the terms "and" and "or" may be used interchangeably to refer to a set of items in both the conjunctive and disjunctive in order to encompass the full description of combinations and alternatives of the items. By way of example, a set of items may be listed with the disjunctive "or", or with the conjunction "and." In either case, the set is to be interpreted as meaning each of the items singularly as alternatives, as well as any combination of the listed items.

In present disclosure, a neural network-based state estimation (NNSE) method is introduced that achieves higher time efficiency, better robustness against noise, and extended observation when compared to conventional WLS state estimation methods. Embodiments of the present disclosure incorporates a novel neural network-based state estimation with the LSE formulation. Embodiments of the present disclosure also introduce a deep neural network to extend the system observability by building connections between observable and unobservable states. Furthermore, embodiments of the present disclosure develop parallel and distributed formulations to improve computational efficiency of the aforementioned approaches for large-scale power systems.

This specification is organized as follows. Section I briefly discusses the formulations of LSE. Section II introduces a neural network-based state estimation system and method in accordance with embodiments of the present disclosure, including a neural network-based LSE (NNLSE), a neural network-based unobservable state estimation (NNUSE), and a multi-thread training and updating architecture. Case studies are discussed in section III.

Section I. Linear State Estimation

Linear state estimation leverages the linear relationship between the voltage and current phasors. PMUs are usually installed at the terminals of lines in an electric power system, and their measurements include 3-phase current and voltage phasors in polar coordinates. Transmission systems are usually considered to be three-phase-balanced in the present analysis. Hence, positive sequence measurements can be extracted from 3-phase measurements through the phase-to-sequence transformation in equation (1), where $V_{012}$ denotes the sequence voltage phasor vector, which includes zero, and positive and negative sequence labeled as 0, 1, and 2, respectively. $V_{ABC}$ is the three-phase voltage phasor vector of A, B, and C phases directly from PMU measurements. Transmission-level LSE is generally implemented upon the positive sequence measurements.

$$V_{012} = \frac{1}{3}\begin{bmatrix} 1 & 1 & 1 \\ 1 & \alpha & \alpha^2 \\ 1 & \alpha^2 & \alpha \end{bmatrix} V_{ABC} \qquad (1)$$

For a system with N nodes and L lines, in which some nodes and lines are deployed with PMUs so that there are n voltage measurements and l current measurements, the state vector $\vec{x} \in \mathbb{C}^{N \times 1}$ includes the voltage phasors of all nodes. The measurement vector $\vec{z} \in \mathbb{C}^{(n+l) \times 1}$ includes the voltage and current phasors of the terminals with PMU installation. The measurement model of PMU data can be derived from Ohm's law as formulated in equation (2), where $A \in \mathbb{R}^{n \times N}$ is the relationship matrix between the state vector $\vec{x}$ and voltage phasor measurement vector $\vec{V}$. If the voltage phasor of node j is the $i^{th}$ component in the measurement vector of voltage phasors, then $A_{i,j}=1$; otherwise $A_{i,j}=0$, where $A_{i,j}$ is the element of A on the $i^{th}$ row and $j^{th}$ column. Matrix $Y_f \in \mathbb{C}^{l \times N}$ is the from-end system admittance matrix used to calculate the current injection at the "from" end of the measured lines. By combining the voltage and current measurements into one formulation, the measurement model of PMU data can be represented by the complex matrix $\dot{H}$ in equation (3).

$$\begin{cases} \vec{V} = A\vec{x} \\ \vec{I_f} = Y_f \vec{x} \end{cases} \qquad (2)$$

$$\vec{z} = \begin{bmatrix} \vec{V} \\ \vec{I_f} \end{bmatrix} = \begin{bmatrix} A \\ Y_f \end{bmatrix} \vec{x} = \dot{H}\vec{x} \qquad (3)$$

Although the model in equation (3) is linear, its components are complex numbers. It can be further expanded into a rectangular-coordinate formulation in equation (4). The corresponding measurement model becomes equation (5), where $H_{real}$ and $H_{imag}$ are the real and imaginary part, respectively, of the $\dot{H}$ matrix. Matrix H represents the linear model for linear state estimation in rectangular form.

$$x = \begin{bmatrix} \text{real}(\vec{x}) \\ \text{imag}(\vec{x}) \end{bmatrix}, z = \begin{bmatrix} \text{real}(\vec{z}) \\ \text{imag}(\vec{z}) \end{bmatrix} \qquad (4)$$

$$z = \begin{bmatrix} H_{real} & -H_{imag} \\ H_{imag} & H_{real} \end{bmatrix} \qquad (5)$$

$$x = Hx$$

Based on the formulation in equation (5), it is possible to solve for the states directly. The solution of x is given in equation (6), where the weighted pseudo-inverse of H is calculated using the Moore-Penrose method (E. H. Moore, "On the reciprocal of the general algebraic matrix," Bull. Am. Math. Soc., vol. 26, pp. 394-395, 1920). Matrix $W \in \mathbb{R}^{(n+l) \times (n+l)}$ is a diagonal matrix, of which the diagonal components are weights for the corresponding measurements.

$$\hat{x} = (H^T W^{-1} H)^{-1} H^T W^{-1} z \qquad (6)$$

Section II. Neural Network-Based State Estimation

FIG. 1 shows an architecture of a neural network-based state estimation (NNSE) method according to an embodiment of the present disclosure. Three-phase PMU measurements, i.e., PMU stream 102, are transformed into sequence data by a PMU data pre-processing 110, which transforms three phase voltage/current phasor measurements into positive sequence data z and perform certain bad data filtering including normalizing the data into a pre-set range that is suitable for the input of an LSE-net 120. The positive sequence data z is then fed into the LSE-net module 120, which is an observable state estimator. Outputs from the LSE-net module 120 are estimated states $\hat{x}$ which contain both observable and unobservable states. The LSE-net module 120 is randomly initialized in the beginning, and a short pre-training is needed before online implementation. Such initialization and pre-training are performed by a initialing and pre-training module 130. Updating parameters of the LSE-net module 120 is achieved by a stochastic gradient descent (SGD)-based backpropagation module 140 in an independent thread synchronized at PMU reporting rate. The SGD-based backpropagation module 140 calculates loss and gradient of LSE-net module 120.

Nominally, observable and unobservable states can be distinguished by their convergence. The estimation of the observable states is expected to converge to the actual states, while the estimation of unobservable states is updated less frequently.

Referring again to FIG. 1, the estimated states 2 are further fed into a USE-net module 150 to receive estimations of unobservable states. A final estimation 2' is a concatenation of the estimated observable and unobservable states. The USE-net module 150 is an off-line trained neural network that learns the veiled relationship between observable states and unobservable states. The training data set consists of simulation data and historical data. Simulation data sets up the baseline of outputs; and the historical data helps the estimator to capture recent slow dynamics of the system and is updated periodically. The training process of the USE-net 150 by the off-line training module 160 consumes more time than the online training of the LSE-net module 120. Hence, the time intervals for updating the USE-net parameters is longer. To avoid conflict between the networks, updating the LSE-net module 120 and the USE-net module 150 are performed under two independent threads. This multi-thread updating architecture aims to reduce the estimation time and prevent numerical failure propagation.

A. Observable State Estimation

Figure 2:
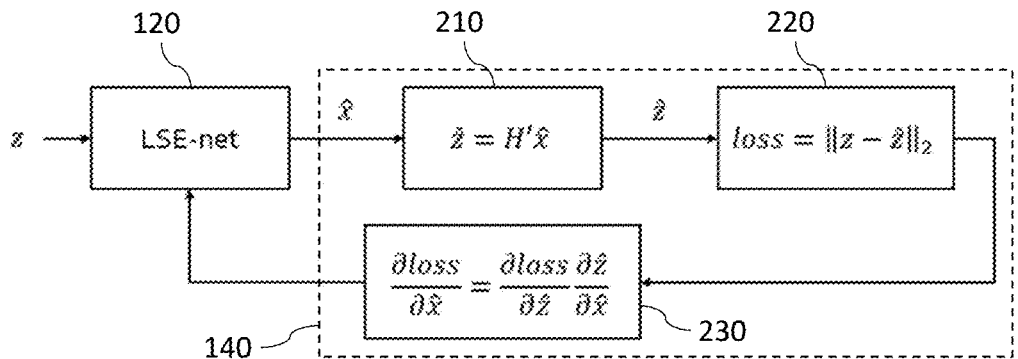

FIG. 2 shows a flowchart of a neural network-based linear state estimation (NNLSE) process in accordance with an embodiment of the present disclosure. The LSE-net module 120 is a 3-layer feed-forward neural-network that takes the input of measurement vector z and yields an output of the estimated state $\hat{x}$. This section introduces the NNLSE process from three aspects: a) an architecture of the proposed neural network-based state estimator; b) a backpropagation and loss function of the NNLSE; c) an SGD training of the NNLSE.

1) The Proposed State Estimator: feed-forward neural-networks are widely used for universal function approximation. They usually contain three or four layers: one input layer, several hidden layers, and one output layer. The layers consist of neurons, which are the smallest units needed to build a neural network.

Figure 3:
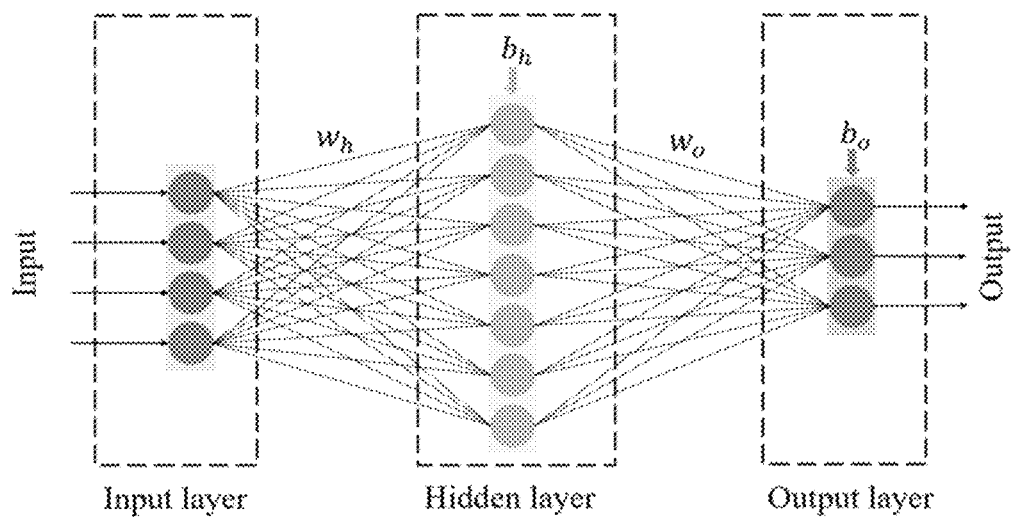

FIG. 3 shows a feed-forward neural-network structure. Equation (7) is the forward propagation calculation, where z is the input measurement vector and matrix $w_h$ and $w_o$ are the weight matrices for the hidden layer and output layer, respectively. Vectors $b_h$ and $b_o$ are the bias vectors applied to the hidden layer and output layer. $\alpha_h$ and $\alpha_o$ represent the activation functions that introduce nonlinearity to the network. In some embodiments, a sigmoid function formulated in equation (8) as a hidden layer activation function is chosen for the proposed NNLSE. The output layer activation function is a linear function to avoid applying limits on the range of output values.

$$x = a_o(w_o \times a_h((w_h \times z) + b_h) + b_o) \quad (7)$$

$$sig(x) = \frac{1}{1 + e^{-x}} \quad (8)$$

As shown in FIG. 2, a measurement model 210 is inserted between the output of the LSE-net module 120 and a loss function 220. The loss is defined as the L2 norm of estimated measurement residual defined in equation (9). Vectors z and $\hat{z}$ are the actual and estimated measurement vectors. Variables $z_i$ and $\hat{z}_i$ denotes the $i^{th}$ element of z and $\hat{z}$, respectively. Constant M is a dimension of the measurement vector. The loss is calculated after the measurement model 210 because the value of actual states is unknown and the target value of states is not accessible. However, the measurements and the estimated measurements are comparable and can reflect the gaps between the estimated states and the actual states, which are minimized indirectly by minimizing the measurement residual through equation (9).

$$Loss = \|z - \hat{z}\|_2 = \left(\sum_{i \leq M}(z_i - \hat{z}_i)^2\right)^{\frac{1}{2}} \quad (9)$$

The LSE-net module 120 is updated by a backpropagation (BP) module 230 through online training. A gradient, which is also known as partial derivative, of the loss function to each network parameter is calculated through a chain-rule and multiplied by a learning rate $\eta$ to get the update step size. A gradient of the output $\hat{x}$ of the LSE-net module 120 is derived separately in equation (10) because the BP module 230 through the measurement model 210 is a specialized part of the NNLSE. An inherent BP within LSE-net module 120 is after the gradient of $\hat{x}$ as formulated in equation (11). Variable u denotes the intermediate output of the hidden layer, and the matrix $H^+$ is a pseudo inverse of the measurement model H'.

$$\begin{cases} \frac{\partial Loss}{\partial \hat{z}} = \frac{\partial \|z - \hat{z}\|_2}{\partial \hat{z}} \\ \frac{\partial Loss}{\partial \hat{x}} = \frac{\partial Loss}{\partial \hat{z}} \frac{\partial \hat{z}}{\partial \hat{x}} \\ \frac{\partial \hat{z}}{\partial \hat{x}} = H'^+ \end{cases} \quad (10)$$

$$\begin{cases} \frac{\partial Loss}{\partial b_o} = \frac{\partial Loss}{\partial \hat{x}} \frac{\partial \hat{x}}{\partial b_o} \\ \frac{\partial Loss}{\partial w_o} = \frac{\partial Loss}{\partial \hat{x}} \frac{\partial \hat{x}}{\partial w_o} \\ \frac{\partial Loss}{\partial b_h} = \frac{\partial Loss}{\partial \hat{x}} \frac{\partial \hat{x}}{\partial u} \frac{\partial u}{\partial b_h} \\ \frac{\partial Loss}{\partial w_h} = \frac{\partial Loss}{\partial \hat{x}} \frac{\partial \hat{x}}{\partial u} \frac{\partial u}{\partial w_h} \end{cases} \quad (11)$$

With the loss function 220, as well as the gradient and learning rate $\eta$ determined, the neural network can be updated in a gradient descent (GD) manner to minimize the loss as formulated in equation (12), where $\eta$ is the learning rate, whose value is usually tuned to between 0.0001 and 0.01.

$$\begin{cases} b_o = b_o - \eta \frac{\partial Loss}{\partial b_o} \\ w_o = w_o - \eta \frac{\partial Loss}{\partial w_o} \\ b_h = b_h - \eta \frac{\partial Loss}{\partial b_h} \\ w_h = w_h - \eta \frac{\partial Loss}{\partial w_h} \end{cases} \quad (12)$$

2) Stochastic Gradient Descent (SGD) Training of the NNLSE: In traditional gradient descent (GD) optimization, the average gradient of all data points is used to update the estimation. In neural network training, GD is still an efficient method for linear or quadratic cases. However, in non-linear and non-convex cases, the averaged gradient may lead the network toward a local minimum and stop updating. In some other cases, the training data may come in batches, and this becomes time-costly to wait for the entire training data set to be available. Thus, in embodiments of the present disclosure, an SGD optimization is used to train the NNLSE. As a result, the SGD updates the network parameters with the average gradient of a subset of all data points, and iterates through the data set until every subset is visited. The SGD has been proven to have better performance than GD in both computational complexity and converging speed.

Referring again to FIG. 1, the training process of the LSE-net module 120 is an SGD process in the SGD-based backpropagation module 140 which includes the measurement model 210, the loss function 220 and the BP module 230 as shown in FIG. 2. The estimation and updating are performed on each data point, meaning that the batch size is one, and the average gradient of the subset is the gradient itself. Moreover, the batch size is adjustable depending on the accuracy and speed requirement. When the batch size changes, the update step size is calculated upon the average gradient of the data in that batch.

B. Unobservable State Estimation

Figure 4:
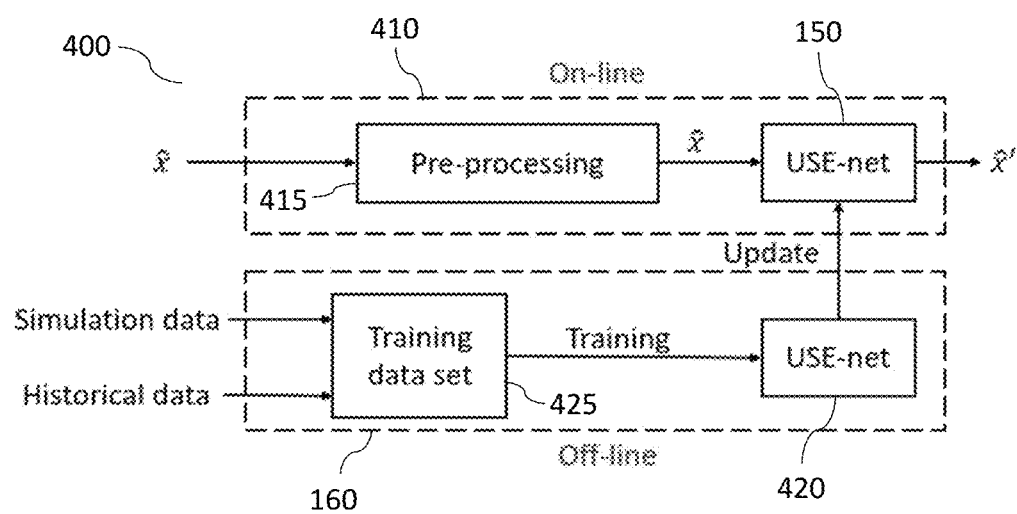

1) Overall NNUSE Approach: FIG. 4 shows a flowchart for an architecture of a complementary unobservable state estimation (USE) module 400 which includes an on-line USE module 410 and the off-line training module 160 complimentary to the USE module 410. The on-line USE module 410 includes a pre-processing module 415 and the USE-net module 150. The pre-processing module 415 normalizes input data, e.g., the estimated states 2 from the LSE-net module 120 shown in FIG. 1, into a pre-set range that is suitable for the input of the USE-net module 150. The USE-net module 150 is an off-line trained 3-layer feed-forward neural network that estimates the unobservable states based on the estimated observable states.

It is challenging to formulate the correlations between the observable and unobservable states analytically. The USE module 400 can be trained to learn this correlation from data.

Referring again to FIG. 4, the off-line training module 160 includes a training data set module 425 and an off-line trained USE-net module 420. The training data set module 425 combines exemplary Monte Carlo simulation data and recent historical data to generate training data. The simulation data is exemplarily generated from a Matlab-based power system analysis tool, and covers a majority of typical operation conditions of the power system to provide general information of the power system. The simulation data set a baseline for the network. The historical data is accumulated in real time to provide some recent system status to the training data. The recent historical data help the network capture the slow dynamics of the system. The training data are then used to train the off-line trained USE-net 420 which is essentially a complementary estimator that stands by to replace the on-line one periodically to make sure the USE-net module 150 in use is trained with recent historical data.

The off-line training module 160 is unavoidably time-consuming. With a large amount of data and input and output dimensions, the network loss can take hours to reach the convergence tolerance. Also, the intermediate status of estimators cannot be applied to online estimation, and only the well-trained one can. Hence, the USE module 420 is unable to capture system dynamics with time constants lower than hours. Parameters the USE module 420 can be updated in the online estimation adapting to slow dynamics. For instance, to capture the system dynamics to a certain extent, parameters of the USE module 420 can be refreshed every few hours by the off-line re-trained network. The training data used for the re-training process is collected dynamically. In this way, the estimation of the USE module 420 is expected to be more accurate.

2) Distance-based Feature Selection for a Distributed NNUSE in Large Scale Systems: an intrinsic challenge associated with neural networks is its scalability. As dimensions of inputs to the neural networks increase, both the weight matrices and bias vectors will increase proportionally. Therefore, the processing time and memory required by the training and estimation computation increase exponentially with the dimension of inputs and outputs. Since the dimensions of measurement vectors, observable states, and measurement model are fixed, the computation complexity of the LSE model does not have much room for improvement in terms of time consumption. However, the NNUSE approach introduced in this section can be further improved through decomposition and parallelism techniques.

In an electric power system, state changes are caused by loading condition variations. It is observed that load profiles tend to be similar among nearby nodes. Inspired by the K-nearest neighbor (KNN) algorithm, in an embodiment, the distributed-NNUSE architecture decouples the estimation of unobservable states into parallel processes.

Figure 5:
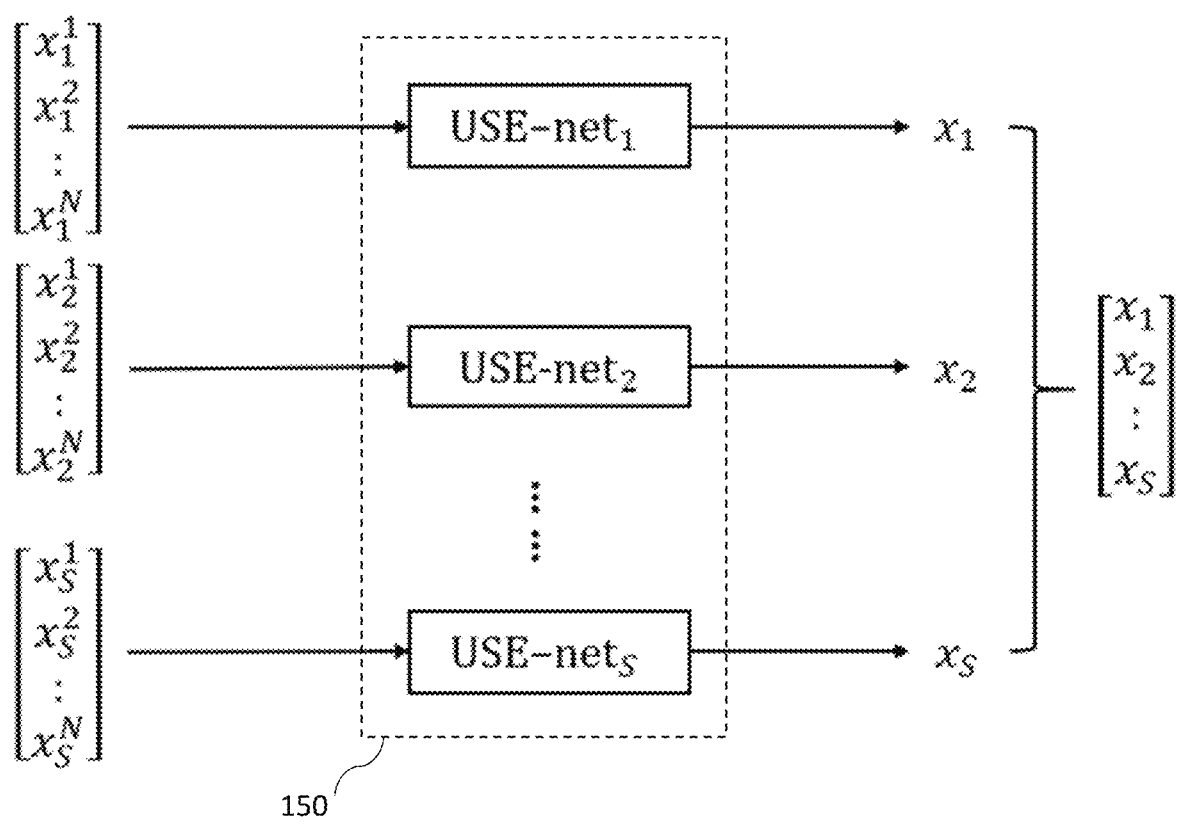

FIG. 5 illustrates an architecture of the parallel processes, where the subscripts indicate the index of unobservable nodes to be estimated. The superscript indicates the index of the nearest neighbor of the target node. The total number of unobservable nodes is S. Each unit of the USE-net module 150 only estimates the states of one unobservable node with the input of states from its N nearest observable nodes in terms of electrical distance. The number of input substations is a hyper-parameter that needs to be fine-tuned. With this architecture, not only the dimension is reduced, but also the unobservable states can be estimated in parallel to achieve higher time efficiency.

C. Multi-thread Estimator Training and Updating

As mentioned in section II-A and section II-B, online estimation, backpropagation, as well as update of LSE-net and USE-net are performed on individual threads. To coordinate these operations so that they work together and minimize the risk of interrupting online estimation, a multi-thread neural network training and updating architecture is proposed.

Figure 6:
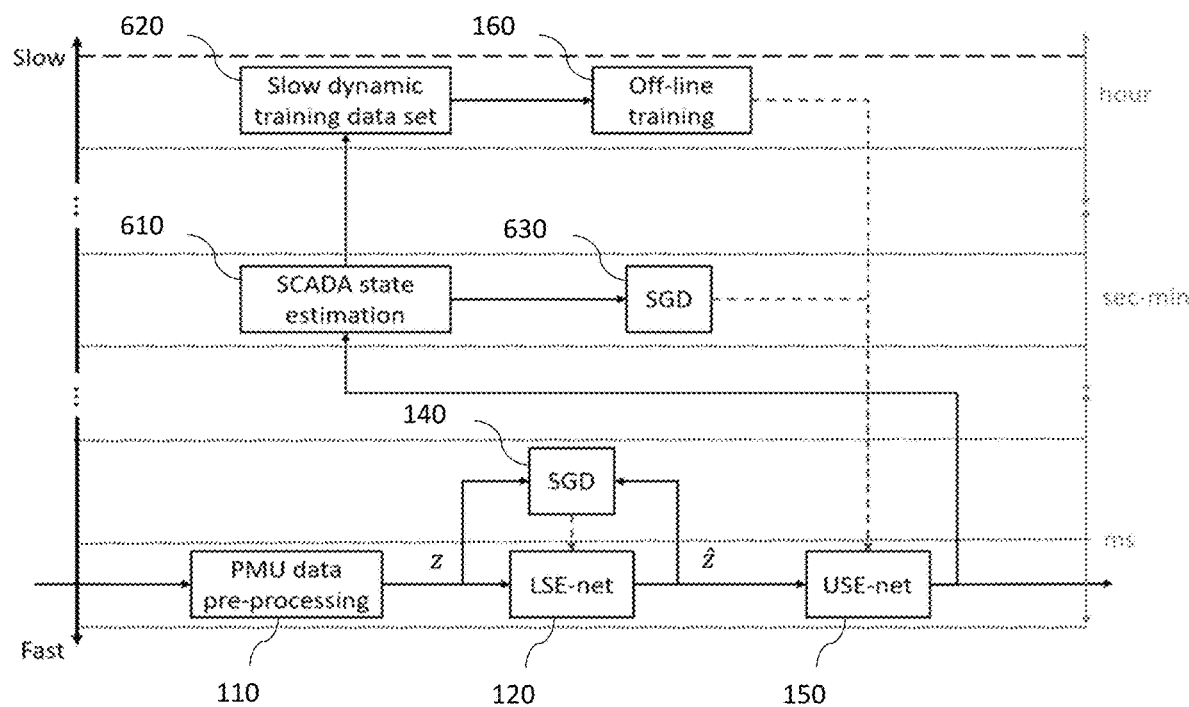

FIG. 6 shows a flowchart of the multi-thread neural network training and updating architecture in accordance with embodiments of the present disclosure. The flowchart illustrates how the network coordinates each module. Solid arrows indicate the flow of data, and dashed arrows indicate the update instructions of neural network parameters. As shown in FIG. 6, the PMU data pre-processing module 110 feeds sequence data z from measurements to the LSE-net module 120 for observable state estimation. Then the estimated states 2 are further fed to the USE-net module 150 for unobservable state estimation. A final estimation is a concatenation of the estimated observable and unobservable states.

Referring again to FIG. 6, both the sequence data z and the estimated states 2 are fed into the SGD-based back-propagation module 140, which calculates a loss upon these two variables. The LSE-net module 120 is then updated upon the calculated loss by the SGD-based backpropagation module 140.

Referring again to FIG. 6, output of the USE-net module 150 is provided to a SCADA state estimation module 610. Estimations generated by the SCADA state estimation module 610 are collected by a slow dynamic training data set 620 and then supplied to the off-line training module 160 for training the USE-net mode 150. At the same time, the estimations generated by the SCADA state estimation module 610 are also supplied to an SGD module 630 which also trains the USE-net 150. In some embodiments, a time interval of SCADA data is 4 seconds, so the SGD training of the USE-net 150 is performed every 4 seconds. The off-line training is very slow, usually takes hours. The off-line trained USE-net will substitute the previously used on-line one every few hours. Before the previous one is substituted, its parameters are also updated every 4 seconds by the SGD training module 630.

Time required to perform the above online operations is in millisecond range. Updating the LSE-net module 120 by the SGD-based backpropagation module 140 is also relatively speedy—in millisecond range. However, time for updating the USE-net module 150 by another SGD module 630 is in second-to-minute range, as in a neural network training, backpropagation consumes the majority of computation time, and this can be volatile. If the backpropagation is included in the online state estimation, not only is the average time efficiency compromised, but it is also difficult to guarantee the upper bond of time consumption at each step. Therefore, in embodiments, the updating of the LSE-net module 120 and the USE-net module 150 are performed under two independent threads. With this multi-thread architecture, the time consumption and the unpredictable part of each training are removed from the online estimation. The updating of the LSE-net module 120 and the USE-net module 150 are decoupled as well. Both neural network-based estimators can be updated at their own frequencies without interrupting the online estimation.

Figure 7:
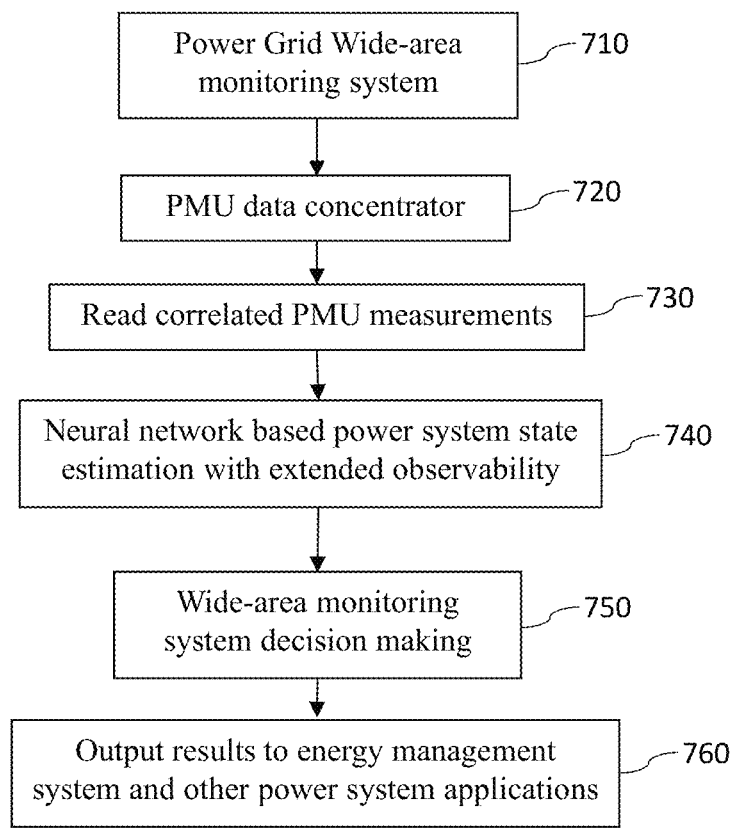

FIG. 7 shows a flowchart illustrating an exemplary application of the state estimation process in an electric power system in accordance with embodiments of the present disclosure. The electric power grid system is monitored by a wide-area monitoring system in step 710. A PMU data concentrator collects and correlates multiple PMU measurements in step 720. Then the correlated PMU measurements in read into a control system in step 730. The control system runs state estimation processes on the correlated PMU measurements according to embodiments of the present disclosure in step 740. The wide-area monitoring system makes decisions in step 750 based on the state estimation performed in step 740. In step 760, the state estimations are outputted to energy management system and other power system applications.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that make the logic or processor. Of note, various embodiments described herein may, of course, be implemented using any appropriate hardware and/or computing software languages (e.g., C++, Objective-C, Swift, Java, JavaScript, Python, Perl, QT, etc.).

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, Software modules or components may be located in local and/or remote memory storage devices. In addition, data being tied or rendered together in a database record may be resident in the same memory device, or across several memory devices, and may be linked together in fields of a record in a database across a network.

Section III. Case Studies

The NNSE of the present disclosure is tested under two systems. An IEEE 118-bus system is used in a first case study to show the comprehensive performance in large-scale simulated systems in terms of estimation accuracy, time efficiency, and robustness against noise. The LSE is applied to this system as a benchmark. Data are generated in MATPOWER, a power system analysis toolbox run in Matlab (R. D. Zimmerman, C. E. Murillo-S'anchez, and D. Gan, "Matpower: A matlab power system simulation package," Manual, Power Systems Engineering Research Center, Ithaca N.Y., vol. 1, 1997). The PMU data reporting frequency is set to 50 Hz.

To justify the performance of the disclosed method in real world applications, we applied the NNSE to a practical system using real PMU data in the second case. This test system is the high voltage level transmission system of the Jiangsu province power grid. Both PMU data and SCADA results are collected and stored in time series. The NNSE and LSE are performed based on the PMU data, while SCADA acts as the reference to check the accuracy when their time stamp overlaps. Note that the data are not collected in real-time, but are read from a database in time-series order so that the disclosed NNSE acts as an online estimation in the simulation. The PMU reporting rate in the Jiangsu system is 25 Hz.

A. The IEEE 118-Bus Test Case

Figure 8:
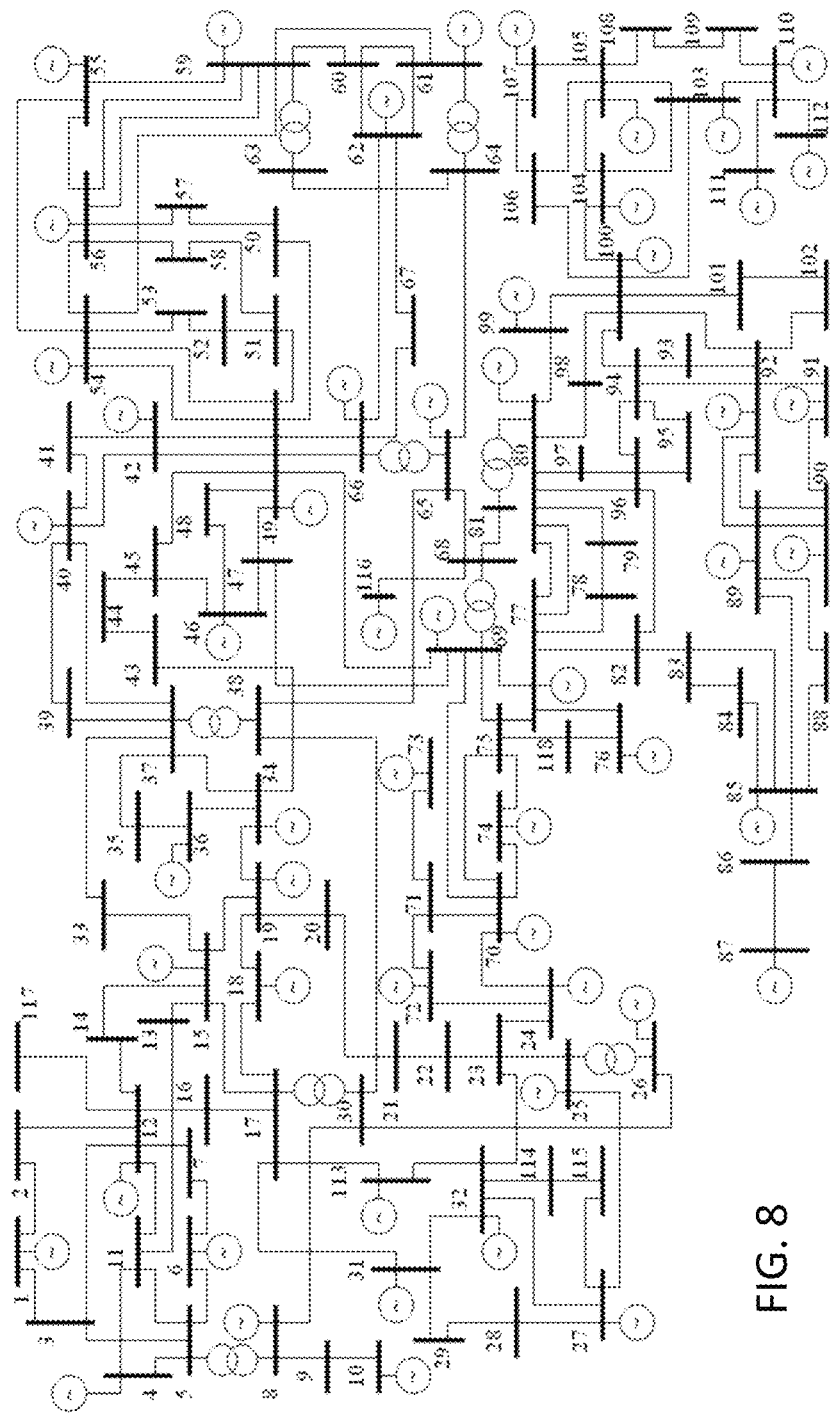

FIG. 8 shows the topology of the IEEE 118-bus system. PMUs are placed at the 54 generator buses to measure the voltage phasors and the current phasors on the 151 connected lines. There are 5 unobservable buses under such PMU placement, buses 21, 22, 44, 52, and 95. The simulation is a 1-second steady-state window, and the learning rate of LSE-net is set to 0.01. The batch size of SGD for LSE-net update is 1. The measurement noise complies with a normal distribution of N (0, $0.03^2$).

Figure 9:
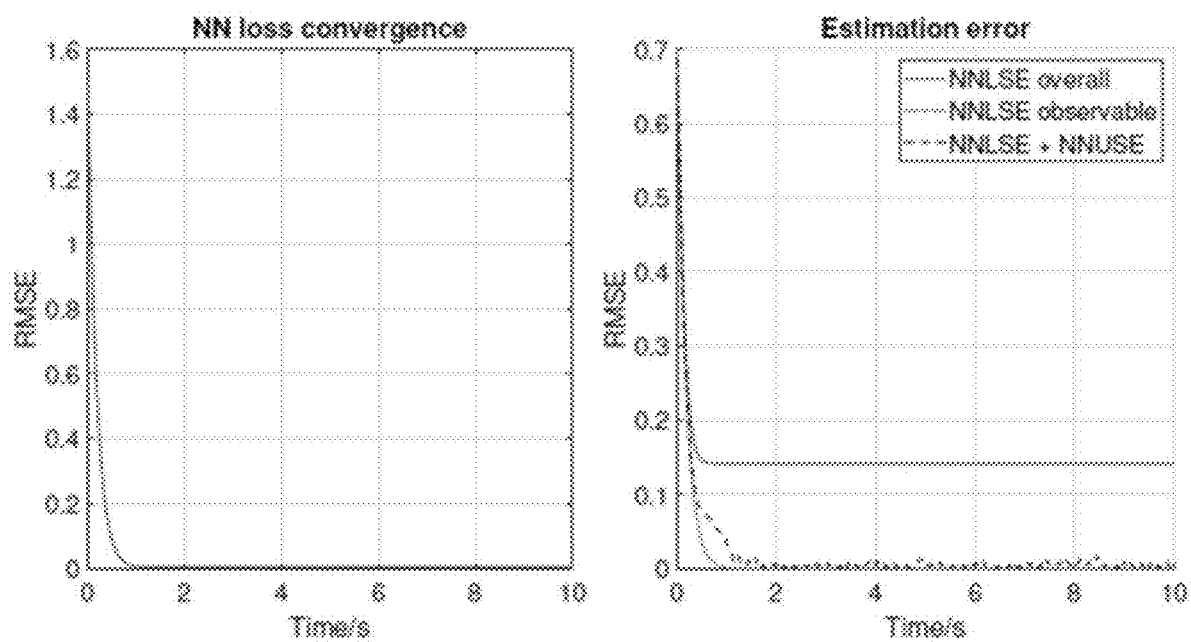

1) Convergence: FIG. 9 indicates that the loss of LSE-net estimator and the root mean square error (RMSE) of estimation error on the observable states are well converged. The estimation error without USE-net is seen as converging only to 0.15 due to the non-convergence of the unobservable states. With the help of the USE-net, the total estimation error is greatly reduced and close to the convergence of the observable states. The convergence takes approximately 1 second, which equals to 50 iterations.

Figure 10:
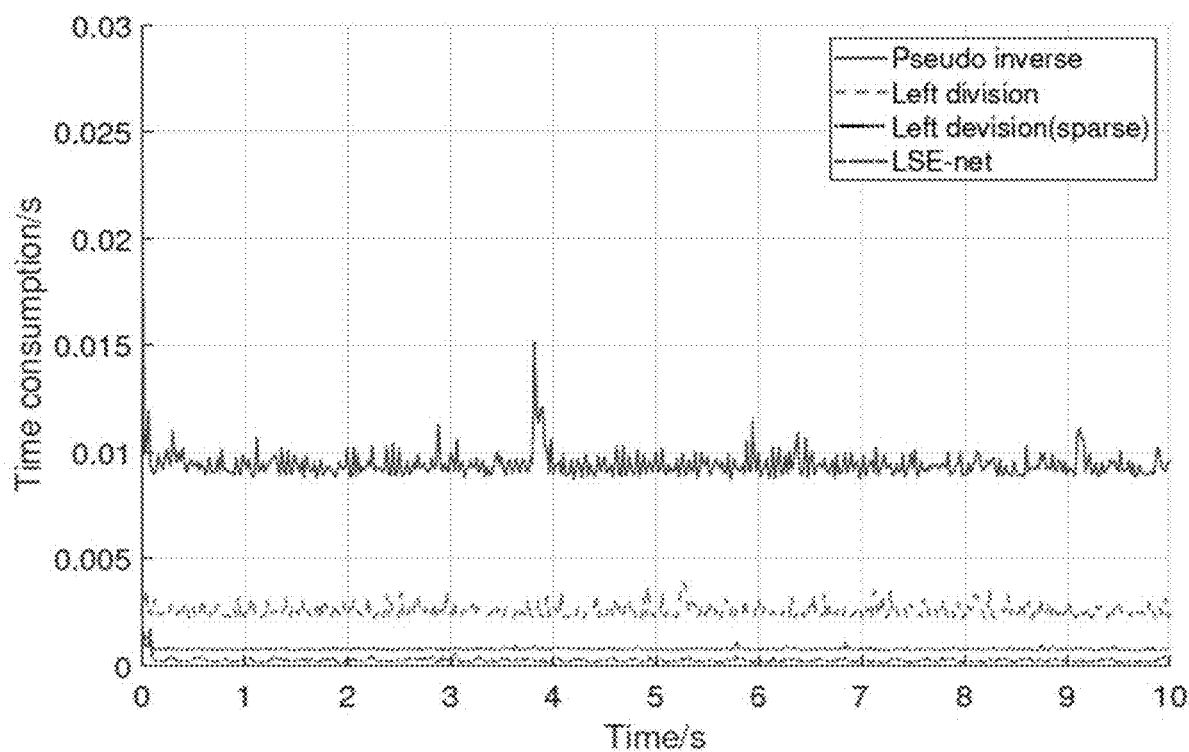

2) Time consumption: one of the motivations of the proposed method is to improve the computation efficiency. The time consumption of the NNSE of the present disclosure is compared with several versions of LSE, which is then solved upon different matrix handling algorithms. The base method is labeled as LSE-PI, which solves the H matrix when using the Moore-Penrose algorithm (R. Penrose, "A generalized inverse for matrices," in Mathematical Proceedings of the Cambridge Philosophical Society, vol. 51, no. 3. Cambridge University Press, 1955, pp. 406-413). The improved method using the Cholesky decomposition is labeled as LSE-LD (K. Tanabe and M. Sagae, "An exact cholesky decomposition and the generalized inverse of the variance-covariance matrix of the multinomial distribution, with applications," Journal of the Royal Statistical Society: Series B (Methodological), vol. 54, no. 1, pp. 211-219, 1992). Due to the sparsity of matrix H, the computation complexity can be further reduced with the Cholesky decomposition for sparse matrices, and this method is labeled as LSE-LDS (T. A. Davis and W. W. Hager, "Modifying a sparse Cholesky factorization," SIAM Journal on Matrix Analysis and Applications, vol. 20, no. 3, pp. 606-627, 1999). To make a fair comparison, the USE-net is not included because the LSE based methods are unable to estimate the unobservable states. The comparison of the step-wise time consumption curves of these four methods is seen in FIG. 10. The LSE-PI and the LSE-LD are the slowest methods. The LSE-LDS is faster than the NNLSE in the first few steps, but its curve is above the NNLSE curve for the rest of the time steps. The average time consumption of the four methods is compared in Table I. Although LSE-LDS is fast, the NNLSE still outperforms it by using less than half of the time, which is only 10.48% of the LSE-LD and 2.68% of the LSE-PI.

TABLE I

Comparison of Average Time Consumption Per Step

|  | LSE-PI | LSE-LD | LSE-LDS | LSE-net |
|---|---|---|---|---|
| Average time(ms) | 8.2 | 2.1 | 0.52 | 0.22 |

Figure 11:
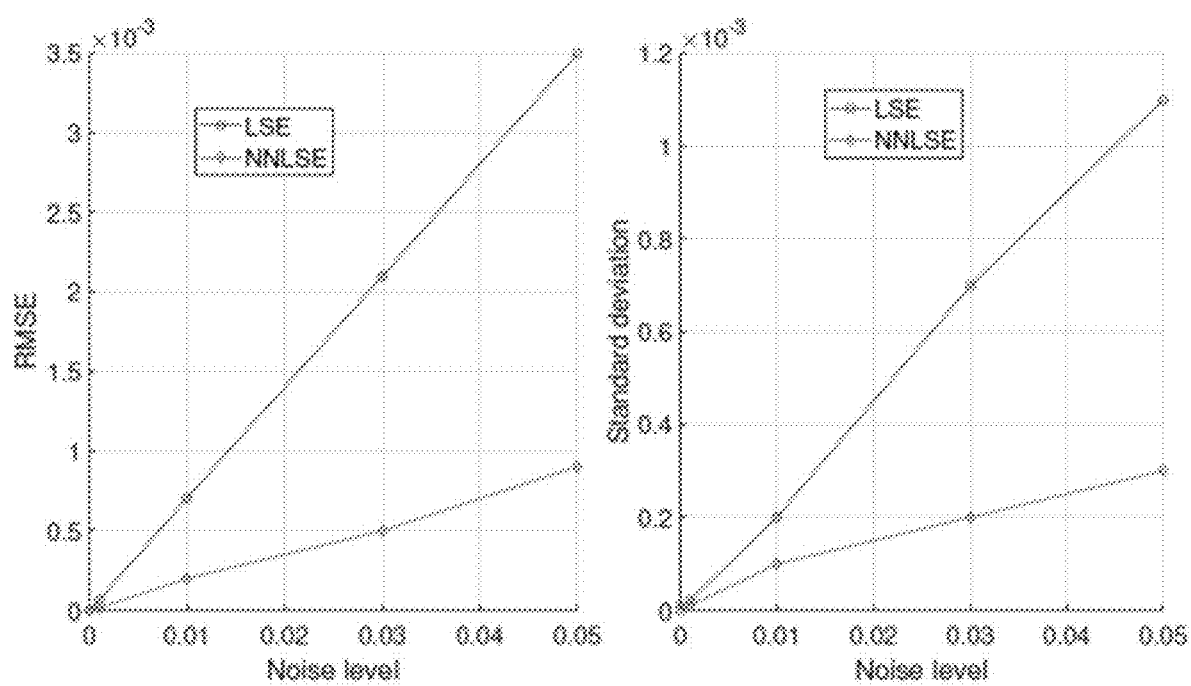

3) Robustness against noise: it is indisputable that LSE is the "optimal" state estimation solution in theory. However, it is unavoidable to have measurement noise in real-world measurements. Therefore, the robustness against noise is important for online state estimations. In order to test the robustness of the NNSE according to embodiments of the present disclosure, the estimation error and standard deviation are compared to LSE results under five different noise levels. To separate the impact from the warm-up stage of the LSE-net, the estimator, in this case, is pre-trained to a nearby solution. The comparison of the estimation performance is summarized in Table II and FIG. 11. The estimation error of the NNSE is less sensitive to noise than LSE.

TABLE II

Estimation Error Against Noise Levels

|  |  | No noise | 0.001 | 0.01 | 0.03 | 0.05 |
|---|---|---|---|---|---|---|
| LSE | RMSE | 3.13e−15 | 0.688e−4 | 0.0007 | 0.0021 | 0.0035 |
|  | std | 3.16e−30 | 0.222e−4 | 0.0002 | 0.0007 | 0.0011 |
| NNLSE | RMSE | 0.228e−5 | 0.186e−4 | 0.0002 | 0.0005 | 0.0009 |
|  | std | 0.125e−4 | 0.109e−4 | 0.0001 | 0.0002 | 0.0003 |

Figure 12:
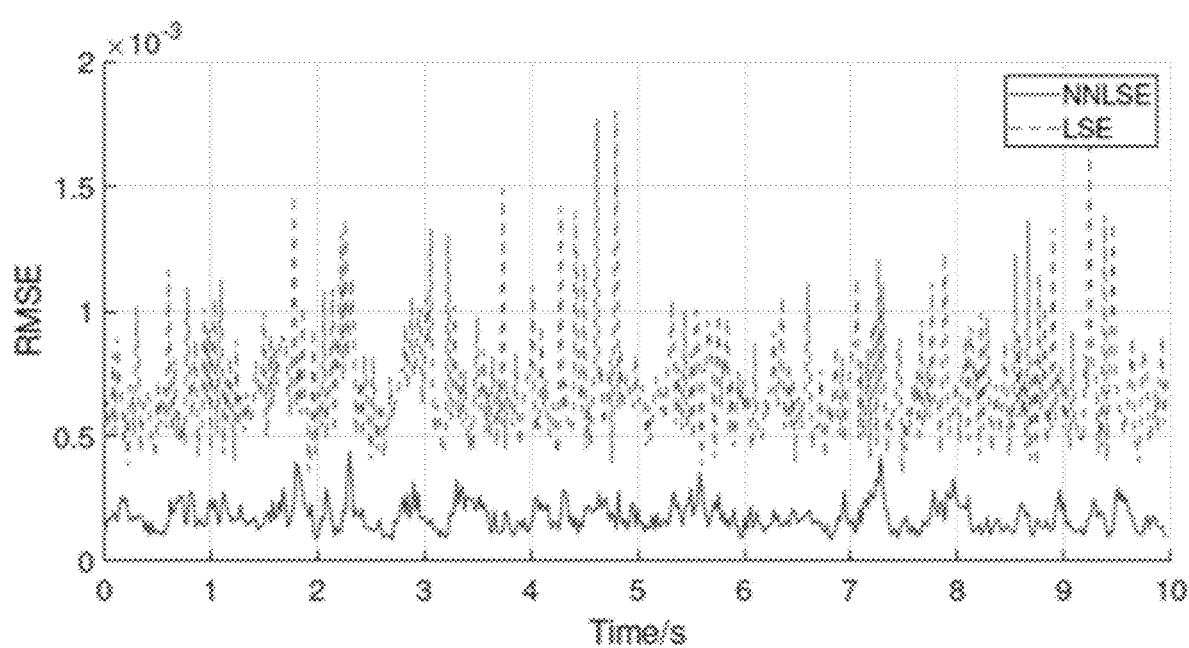
Figure 13:
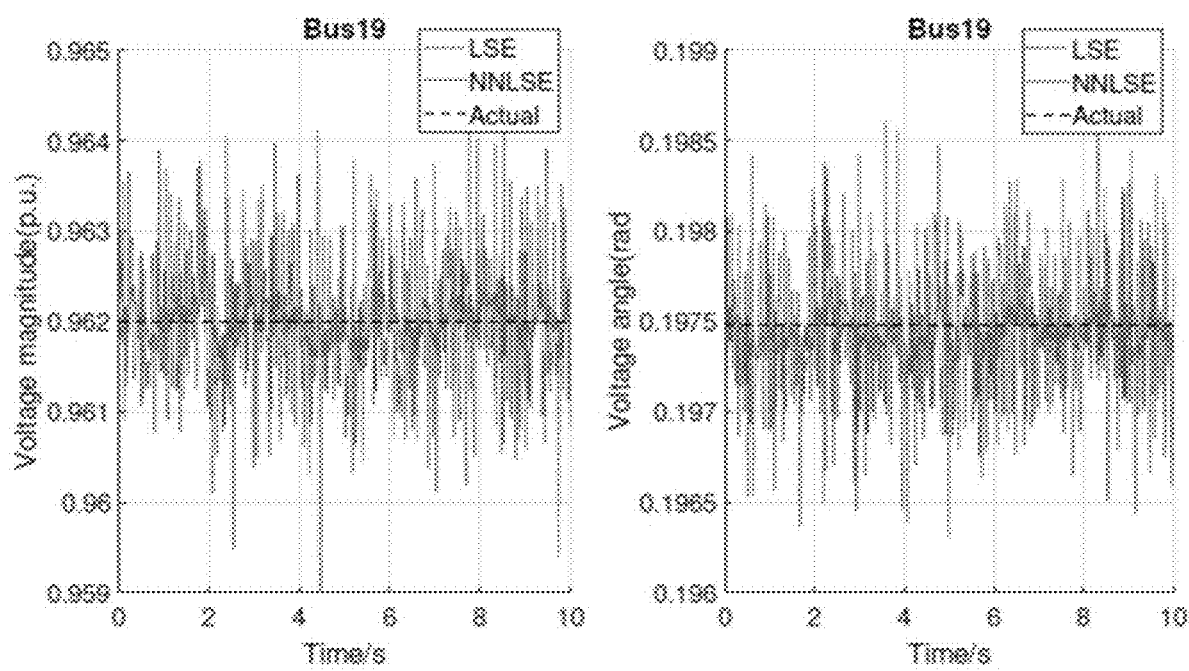

An example of step-wise estimation error curves is given in FIG. 12, where the noise level is 0.01. It shows that the estimation error of the NNLSE is less than the LSE at every step. The estimation results converted into polar coordinates are given in FIG. 13. An estimation by the LSE is noisier than the NNLSE estimation.

4) Response to state changes: in real-time power system operations, the states are always changing due to the volatility of load and generation. The state estimation algorithms are expected to capture the relatively slow dynamics of state changes. In this case, a load ramp-down scenario is designed to test the estimation performance under state changes. The average ramp-down rate is 1% per second, which is a steep change for transmission-level power systems. The average load factor decreases from 1 to 0.99 in the 1-second interval from the 3rd second to the 4th second. But, the load and generation are not adjusted homogeneously. The random volatility factor is applied to each load and generator to make the scenario more realistic. The measurement noise level applied is 0.01. Therefore, the actual states during the ramp-down transient are fluctuating.

The average estimation error and the corresponding standard deviation during the 1-second ramp-down window are summarized in Table III. It suggests that the neural network estimator has a lower estimation error during the transient. This is because the estimator is capable of tracking the dynamics of the load changes and being robust against noise.

TABLE III

Estimation Accuracy Under State Ramp Changes

|  | LSE | NNLSE |
|---|---|---|
| RAISE | 0.0008 | 0.0003 |
| std | 0.0002 | 0.0001 |

Figure 14:
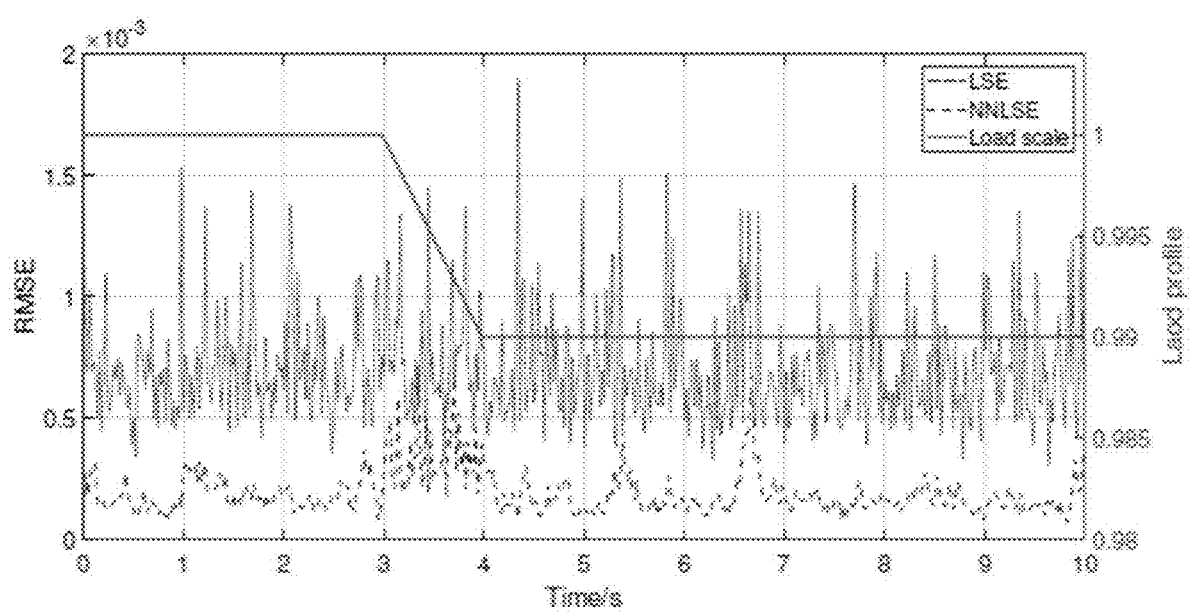

The step-wise estimation error and the load profile curves are illustrated in FIG. 14. The NNLSE estimation error during the transient is higher than the steady-state results but still lower than the LSE results.

Figure 15:
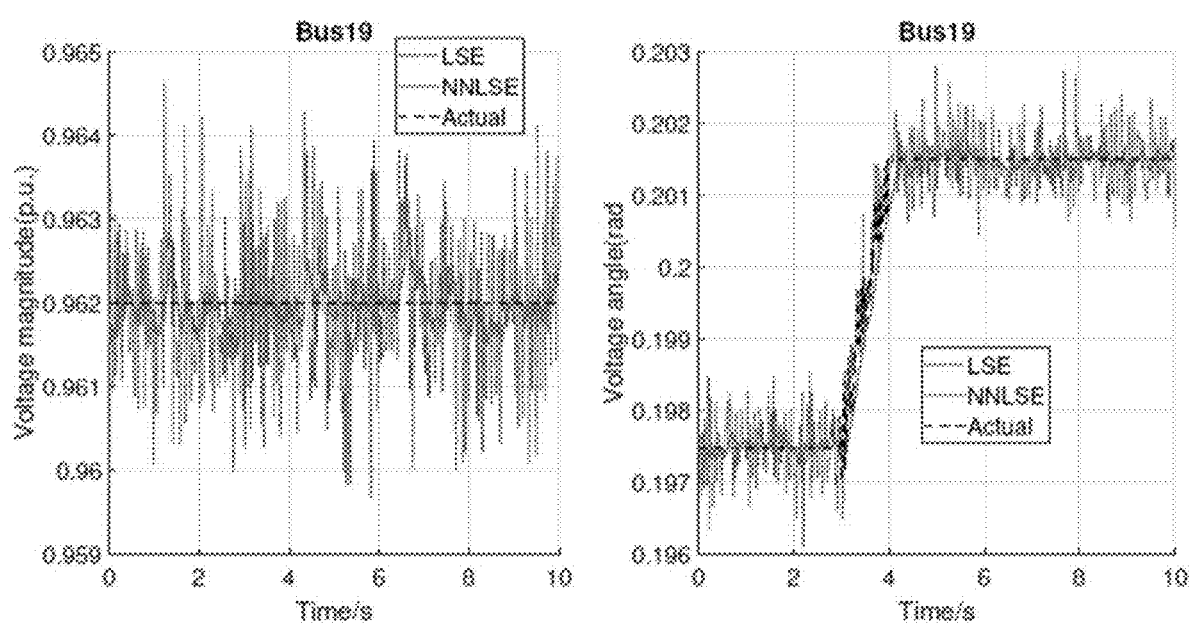

FIG. 15 shows the estimation of bus 19 during the transients, which mainly affects the voltage angle; the voltage magnitude change is less affected.

5) Response to topology change: breaker status change and line tripping happen in power system operations from time to time. It is important that state estimation algorithms are capable of adapting to topology changes. This test case compares the performance of the LSE and the NNLSE under a topology change scenario, where the line from bus 3 to bus 5 is opened at the 3rd second. The dimensions of the state vector and measurement vector are the same before and after the topology change, thus the dimensions of the NN-based estimator is compatible with the new measurement model. A fast transient of opening the breaker is neglected, and the system topology is known before and after the change.

Figure 16:
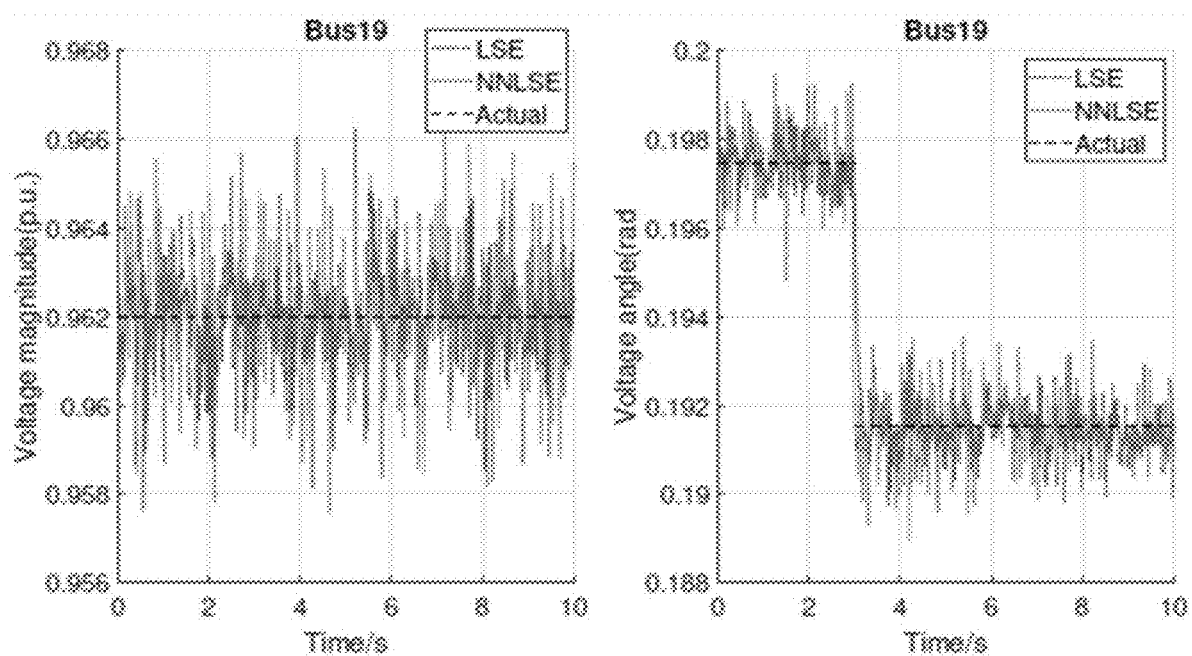

FIG. 16 shows trajectories of the estimation from the LSE and the NNLSE. The actual states under equilibrium before and after the topology change are denoted by the dashed lines. The impact of topology change is insignificant on voltage magnitude, while the voltage angle change is more visible. When the topology changes, LSE responds instantly due to its non-iterative solution nature. But the parameters of the NN-based estimator need to be updated through iterations. The convergence of the NNLSE to the new equilibrium point takes approximately 0.1 seconds (5 steps), which is short enough to be neglected for static state estimation. The updating period of NN compromises the estimation accuracy but still outperforms the LSE because of its better robustness against noise as discussed in section III-A.3.

B. Jiangsu Grid

The Jiangsu power grid has the second largest total energy consumption in China; the grid also has four HVDC terminals, which receive power from Shanxi, Sichuan, Hubei, and Inner Mongolia. The Jiangsu system consists of thousands of nodes at the transmission level. More importantly, it has the highest PMU installation penetration in China. The reporting rate is 25 Hz. A high requirement for system stability, large system scale complexity, and a need for good observability due to extensive PMU coverage, together make the Jiangsu system suitable for the LSE and the NNSE study.

This numerical experiment covers the high voltage (220 kV and above) level transmission system of Jiangsu province system that includes 763 substations at voltage levels of 230 kV, 525 kV, and 1000 kV. The number of substations from each voltage level is summarized in Table IV. 132 substations are equipped with high quality and reliable PMU, resulting in 235 substations nominally observable. The states of the observable substations are estimated by the NNLSE. The remaining 528 nominally unobservable substations are estimated via the NNUSE. The SCADA results, offering observability of the entire system, are collected to validate estimation accuracy. SCADA results used are essentially the state estimation solutions from the D5000 energy management system (EMS), which are generally considered to be accurate. We use the SCADA-based LSE results as the reference to validate the accuracy of the NNSE method of embodiments of the present disclosure.

TABLE IV

Summary of Substations at Each Voltage Level

| | Voltage level | | |
|---|---|---|---|
| | 1000 kV | 525 kV | 230 kV |
| No. of substations | 4 | 103 | 656 |

As discussed in Section II-B.2, applying the NNUSE on all unobservable states together creates a scalability issue. Therefore, in embodiments, a distributed-NNUSE architecture is implemented to reduce training and estimation time through parallelism. First, a sensitivity study on the hyper-parameter of the input dimension is performed. Table V shows the average error and time consumption of the NNUSE with inputs of 1, 5, 10, 20, and 50 bus states. The average estimation time grows exponentially. In terms of estimation accuracy, 5-input yields the lowest error. 1-input estimation is less accurate because the number of features is too small to approximate the behavior of the target substation. However, with too many inputs, the network could be misled by irrelevant features, and this is the reason errors keep increasing from the 10-input scenario. This sensitivity study serves to fine-tune the hyperparameter of the input number. From these results, a 5-input NNUSE was used for the following tests.

TABLE V

NNUSE Sensitivity to The Number of Inputs

| | No. of inputs | | | | |
|---|---|---|---|---|---|
| | 1 | 5 | 10 | 20 | 50 |
| Estimation error | 0.0567 | 0.0455 | 0.0588 | 0.0586 | 0.6645 |
| Time (ms) | 8.1 | 8.1 | 8.3 | 8.4 | 9.1 |

A comprehensive NNSE is performed on the Jiangsu system based on a 5-input NNUSE, and a comparison with an LSE is summarized in Table VI. The accuracy and standard deviation of unobservable and overall states are not applicable for the LSE and the NNLSE because they can only estimate the nominally observable states. For the same reason, the NNUSE does not have results for observable and overall states. Since the NNSE is a combination of the NNSLE and the NNUSE, it has only the results for overall estimation error and standard deviation. Both the estimation error and the standard deviation of the NNLSE are lower than LSE. Therefore, the NNLSE has higher estimation accuracy in this numerical experiment. For the unobservable states, there are no comparable results from the LSE. The estimation error is still at the same magnitude as the observable state estimation error of the LSE and the NNLSE. The standard deviation of the NNUSE estimation errors is slightly higher than that of the LSE. Hence, the estimation accuracy of the NNUSE is acceptable since it is an extension of nominal observability. The overall estimation error is the average of the NNLSE and the NNUSE, and its accuracy is also acceptable. In terms of time consumption, the neural network-based methods are predominantly faster than the LSE. The total time consumed by the NNLSE and the NNUSE together is 57.5% lower than by the LSE while it expands the estimation to the entire system. Based on the analysis above, it suggests that the NNSE in accordance with embodiments of the present disclosure shows an improved time efficiency, competitive accuracy, and broader estimation observability than the traditional LSE method in a large-scale power system.

TABLE VI

5-Inputs-Based NNSE Performances Breakdown

| | LSE | NNLSE | NNUSE | NNSE |
|---|---|---|---|---|
| Time (ms) | 22.1 | 1.3 | 8.1 | 9.4 |
| Observable | 0.0222 | 0.0209 | — | — |
| std | 0.001 | 0.0009 | — | — |
| Unobservable | — | — | 0.0567 | — |
| Overall | — | — | — | 0.0486 |
| std | — | — | — | 0.001 |

Publications cited throughout this document are hereby incorporated by reference in their entirety. While one or more embodiments of the present disclosure have been described, it is understood that these embodiments are illustrative only, and not restrictive, and that many modifications may become apparent to those of ordinary skill in the art, including that various embodiments of the inventive methodologies, the illustrative systems and platforms, and the illustrative devices described herein can be utilized in any combination with each other. Further still, the various steps may be carried out in any desired order (and any desired steps may be added and/or any desired steps may be eliminated).

What is claimed is:

1. A method for state estimation in an electric power system, the method comprising:
    acquiring electrical measurements from the electric power system by phasor measurement devices at a reporting rate of the electrical measurements; and
    executing software instructions on a processor to perform operations, including:
        processing the electrical measurements into sequence data including positive sequence data;
        processing positive sequence data by an observable state estimator to generate a plurality of estimated states including a plurality of estimated observable states, parameters of the observable state estimator being updated by a first training module in a first time thread;
        processing the plurality of estimated states by an unobservable state estimator to generate a plurality of estimated unobservable states, parameters of the unobservable state estimator being updated by a second training module in a second time thread independent of the first time thread; and
        outputting a plurality of final estimated states generated by concatenating the plurality of estimated observable states and the plurality of estimated unobservable states.

2. The method of claim 1, wherein the phasor measurement devices are a plurality of phasor measurement units coupled to a plurality of lines of the electric power system.

3. The method of claim 2, wherein the electrical measurements include voltage phasors at predetermined nodes of the electric power system and current phasors at predetermined lines of the electric power system.

4. The method of claim 1, wherein each of the observable state estimator and unobservable state estimator employs a neural network-based linear state estimation process.

5. The method of claim 4, wherein each of the observable state estimator and the unobservable state estimator includes an input layer, a predetermined number of hidden layers and an output layer.

6. The method of claim 5, wherein at least one of the predetermined number of hidden layers chooses a sigmoid function formatted in following equation $$sig(x) = \frac{1}{1+e^{-x}}$$

as an activation function.

7. The method of claim 1 further comprising randomly initializing and pre-training the observable state estimator.

8. The method of claim 1, wherein the first training module employs a first stochastic gradient descent (SGD) training process for updating parameters of the observable state estimator; and the second training module employs a second SGD training process for updating parameters of the unobservable state estimator.

9. The method of claim 8, wherein the first training module includes:
a loss function receiving inputs from a measurement model of the electrical measurements for calculating a difference between estimated measurements and actual measurements; and
a gradient of the loss function to provide parameter correction to the observable state estimator.

10. The method of claim 8, wherein the first training module includes averaging gradient of a subset of all data points, and iterating through the data points until every subset is visited.

11. The method of claim 1, wherein the first time thread of the updating of the observable state estimator synchronizes with the reporting rate of the electrical measurements.

12. The method of claim 1, wherein the second time thread is slower than the first time thread.

13. The method of claim 1, wherein the unobservable state estimator is trained to formulate a correlation between observable and unobservable states in the plurality of estimated states.

14. The method of claim 1, wherein the unobservable state estimator includes a plurality of estimation units, each of the plurality of estimation units estimates states of one unobservable node using inputs of states from a predetermined number of observable node nearest to the unobservable node in terms of electrical distance.

15. The method of claim 1, wherein the second training module receives simulation data for setting a baseline for the unobservable state estimator, and historical data for capturing variations of the electric power system.

16. The method of claim 1, wherein the second training module include a trained stand-by estimator replacing the unobservable state estimator periodically.

17. A system for state estimation in an electric power system, the system comprising:
measurement devices coupled to lines of the electric power system for measuring state information at the lines;
a processor; and
a computer-readable storage medium, comprising:
software instructions executable on the processor to perform operations, including:
acquiring electrical measurements from the measurement devices at a reporting rate thereof;
processing the electrical measurements into sequence data including positive sequence data;
processing the positive sequence data by an observable state estimator to generate a plurality of estimated states including a plurality of estimated observable states, parameters of the observable state estimator being updated by a first training module in a first time thread;
processing the plurality of estimated states by an unobservable state estimator to generate a plurality of estimated unobservable states, parameters of the unobservable state estimator being updated by a second training module in a second time thread independent of the first time thread; and
outputting a plurality of final estimated states generated by concatenating the plurality of estimated observable states and the plurality of estimated unobservable states.

18. The system of claim 17, wherein the first time thread of the updating of the observable state estimator synchronizes with the reporting rate of the electrical measurements.

19. The system of claim 17, wherein the second time thread is slower than the first time thread.

20. The system of claim 17, wherein the unobservable state estimator is trained to formulate a correlation between observable and unobservable states in the plurality of estimated states.

21. The system of claim 17, wherein the unobservable state estimator includes a plurality of estimation units, each of the plurality of estimation units estimates states of one unobservable node using inputs of states from a predetermined number of observable node nearest to the unobservable node in terms of electrical distance.

22. The system of claim 17, wherein the second training module include a trained stand-by estimator replacing the unobservable state estimator periodically.

23. A method for state estimation in an electric power system, the method comprising:
acquiring electrical measurements by a plurality of phasor measurement units coupled to a plurality of lines of the electric power system at a reporting rate of the electrical measurements;
processing the electrical measurements into sequence data including positive sequence data;
processing positive sequence data by an observable state estimator using a neural network-based linear state estimation process to generate a plurality of estimated states including a plurality of estimated observable states, parameters of the observable state estimator being updated by a first training module in a first time thread synchronized with the reporting rate of the electrical measurements;
processing the plurality of estimated states by an unobservable state estimator also using a neural network-based linear state estimation process to generate a plurality of estimated unobservable states, parameters of the unobservable state estimator being updated by a second training module in a second time thread independent of and slower than the first time thread; and
outputting a plurality of final estimated states generated by concatenating the plurality of estimated observable states and the plurality of estimated unobservable states.

24. The method of claim 23, wherein the unobservable state estimator includes a plurality of estimation units, each of the plurality of estimation units estimates states of one unobservable node using inputs of states from a predetermined number of observable node nearest to the unobservable node in terms of electrical distance.

25. The method of claim 23, wherein the second training module include a trained stand-by estimator replacing the unobservable state estimator periodically.

* * * * *